United States Patent [19]
New

[11] Patent Number: 6,011,407
[45] Date of Patent: Jan. 4, 2000

[54] FIELD PROGRAMMABLE GATE ARRAY WITH DEDICATED COMPUTER BUS INTERFACE AND METHOD FOR CONFIGURING BOTH

[75] Inventor: Bernard J. New, Los Gatos, Calif.

[73] Assignee: Xilinx, Inc., San Jose, Calif.

[21] Appl. No.: 08/876,909

[22] Filed: Jun. 13, 1997

[51] Int. Cl.$^7$ .................................................. H03K 19/177
[52] U.S. Cl. .................................................. 326/39; 326/40
[58] Field of Search ................................. 326/37–41

[56] References Cited

U.S. PATENT DOCUMENTS

| | | | |
|---|---|---|---|
| 5,469,003 | 11/1995 | Kean | 326/39 |
| 5,600,845 | 2/1997 | Gilson | 395/800 |
| 5,646,544 | 7/1997 | Isdanza | 326/38 |
| 5,801,547 | 9/1998 | Kean | 326/40 |
| 5,838,165 | 11/1998 | Chatter | 326/38 |

OTHER PUBLICATIONS

"The Programmable Logic Data Book", available form Xilinx, Inc., 2100 Logic Drive, San Jose, Ca 95124, 1996, pp. 4–1 through 4–96. No Month.

*Primary Examiner*—Michael Tokar
*Assistant Examiner*—Don Phu Le
*Attorney, Agent, or Firm*—E. Eric Hoffman; Edel M. Young

[57] ABSTRACT

A field programmable gate array is provided which has a programmable portion and a dedicated controller-interface circuit. The programmable portion includes conventional input/output (I/O) blocks and configurable logic blocks (CLBs). The controller-interface circuit allows the FPGA to be operably coupled to an external computer bus, such as a PCI bus. The programmable portion and the controller-interface circuit are separately programmable. As a result, after the controller-interface circuit is initialized, the programmable portion can be cleared and reconfigured without having to re-initialize the controller-interface circuit. The programmable portion is programmed in accordance with an implied addressing scheme in response to a configuration bit stream.

13 Claims, 3 Drawing Sheets

FIELD PROGRAMMABLE GATE ARRAY WITH DEDICATED COMPUTER BUS INTERFACE AND METHOD FOR CONFIGURING BOTH

BACKGROUND OF THE INVENTION

The present invention relates to a field programmable gate array (FPGA). More particularly, the present invention relates to an FPGA having an interface to an external bus and a method for configuring both the FPGA and the interface.

DESCRIPTION OF THE PRIOR ART

FPGAs typically include circuitry which is initially programmed (or configured) in response to an externally provided stream of data values which is commonly referred to as a configuration bit stream. FPGAs typically include a plurality of input/output (I/O) blocks, configurable logic blocks (CLBs), and programmable routing resources (which include interconnect lines with programmable junctions).

FIG. 1 is a schematic diagram of a conventional FPGA programming circuit 100 which provides a serial configuration bit stream to the FPGA. Programming circuit 100 includes a serial bus 101 for receiving a serial configuration bit stream, a parallel bus 102 having n lines for receiving a parallel configuration bit stream, and an input control line 103 for receiving a multiplexer select signal. Data received on parallel bus 102 is converted to a serial bit stream by parallel-to-serial converter circuit 104 and provided to serial data bus 105. Multiplexer 110 is coupled to serial data bus 101, serial data bus 105 and input line 103. If the FPGA is to be programmed from serial data bus 101, the multiplexer select signal on input line 103 is selected to pass the serial bit stream on bus 101. If the FPGA is to be programmed from parallel data bus 102, the multiplexer select signal on input line 103 is selected to pass the serial bit stream on bus 105.

The serial configuration bit stream passed by multiplexer 110 is provided to program the FPGA. The serial configuration bit stream is used to program a plurality of configuration memory cells using an implied addressing scheme. In this implied addressing scheme, the configuration memory cells are programmed in a predetermined order. The sequence of the data values of the configuration bit stream is selected in view of this predetermined programming order. As a result, the configuration memory cells are programmed without having to individually address each of the configuration memory cells. The serial configuration bit stream is also passed to an output pin 106 of the FPGA, thereby allowing other FPGAs to be programmed in a daisy chained manner from the serial configuration bit stream.

The serial configuration bit stream can program the FPGA to provide a controller-interface circuit which allows the FPGA to be accessed by a conventional computer bus, such as a PCI bus. However, a significant portion of the FPGA's resources are required to create such a controller-interface circuit. For example, more than 40 percent of the CLBs of the FPGA may be required to create a controller-interface circuit. Moreover, many of the FPGA's pins are consumed by the PCI input/output interface. In addition, the controller-interface circuit and the rest of the FPGA must be programmed at the same time. That is, each time the FPGA is to be programmed, the controller-interface circuit must also be programmed.

The XC6200 FPGA available from Xilinx, Inc. includes a plurality of addressable configuration memory cells which can be accessed by an external processor through a port of the FPGA. The XC6200 FPGA varies from the previously described conventional FPGAs in that the XC6200 FPGA requires that addresses be provided in order to access these configuration memory cells. The addressing structure is discussed by Kean in U.S. Pat. No. 5,469,003. As previously described, the previously described FPGAs utilize implied addressing.

It would therefore be desirable to have an FPGA which is capable of operating from a computer bus without requiring explicit addressing.

SUMMARY

The present invention provides a FPGA having a dedicated bus controller-interface circuit and a programmable portion which is separate from the dedicated bus controller-interface circuit. The programmable portion includes a plurality of input/output (I/O) blocks, an array of configurable logic blocks (CLBs) and programmable routing resources. The controller-interface circuit enables the FPGA to be operably coupled to an external computer bus, such as a PCI bus.

The controller-interface circuit is initialized from a configuration bit stream received from an internal or external non-volatile memory. After the controller-interface circuit has been initialized, the programmable portion can be configured. The programmable portion is configured in response to a configuration bit stream using an implied addressing scheme. The configuration bit stream is routed through a programming circuit of the FPGA. The programming circuit passes a configuration bit stream from one of three sources: (1) a serial input bus, (2) a parallel input bus, or (3) the external computer bus (via the controller-interface circuit).

Because the controller-interface circuit and the programmable portion are separately programmable, after the controller-interface circuit is initialized, the programmable portion can be cleared and reconfigured without having to re-initialize the controller-interface circuit.

The programming circuit can also include an output terminal which routes the configuration data stream off of the FPGA. As a result, additional FPGAs can be programmed in a daisy-chained manner from the external computer bus.

The present invention will be more fully understood in light of the following detailed description taken together with the drawings.

DETAILED DESCRIPTION

Figure 1:
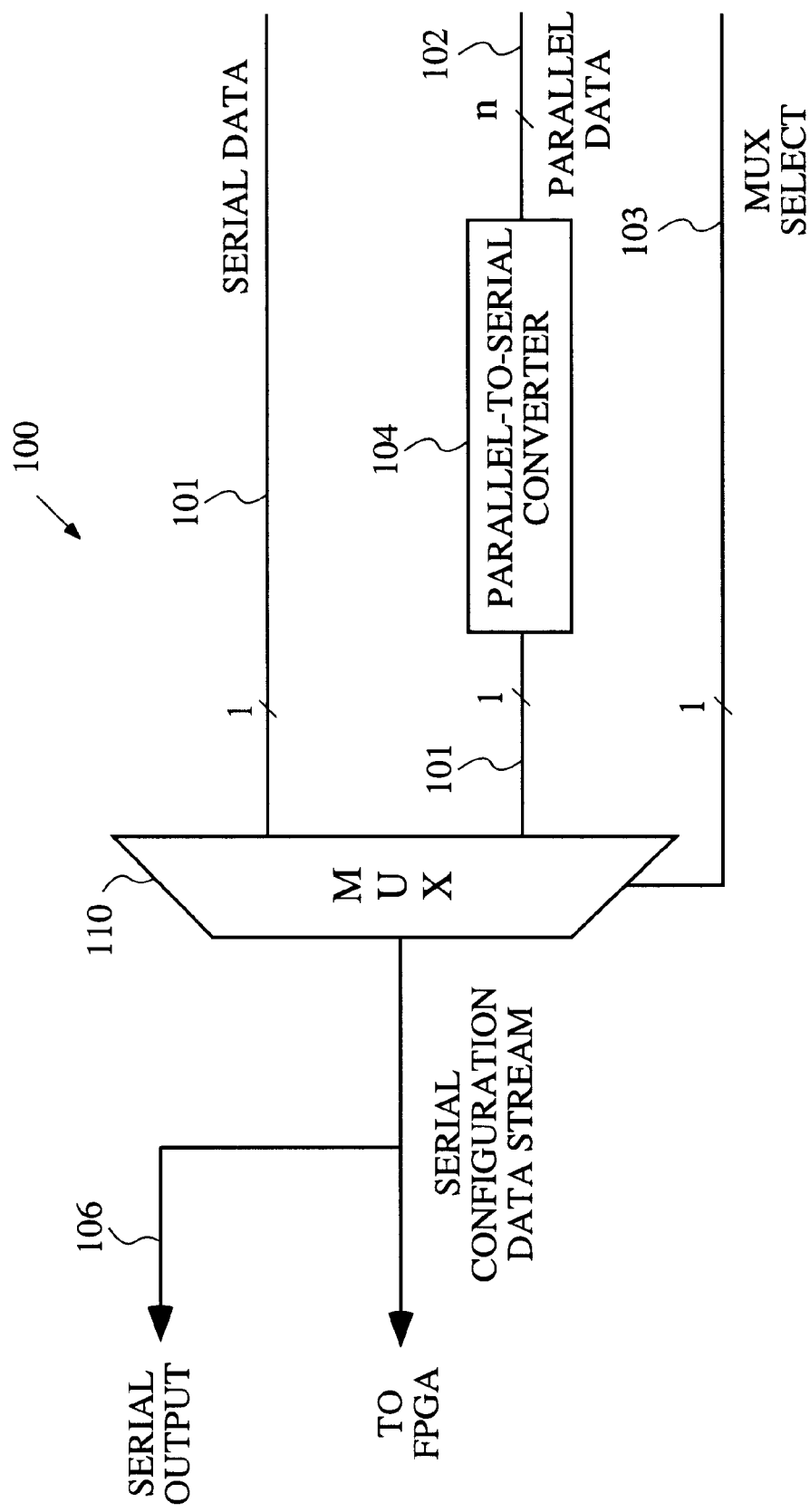
FIG. 1 is a schematic diagram of a conventional FPGA programming circuit which provides a configuration data stream to an FPGA.
Figure 2:
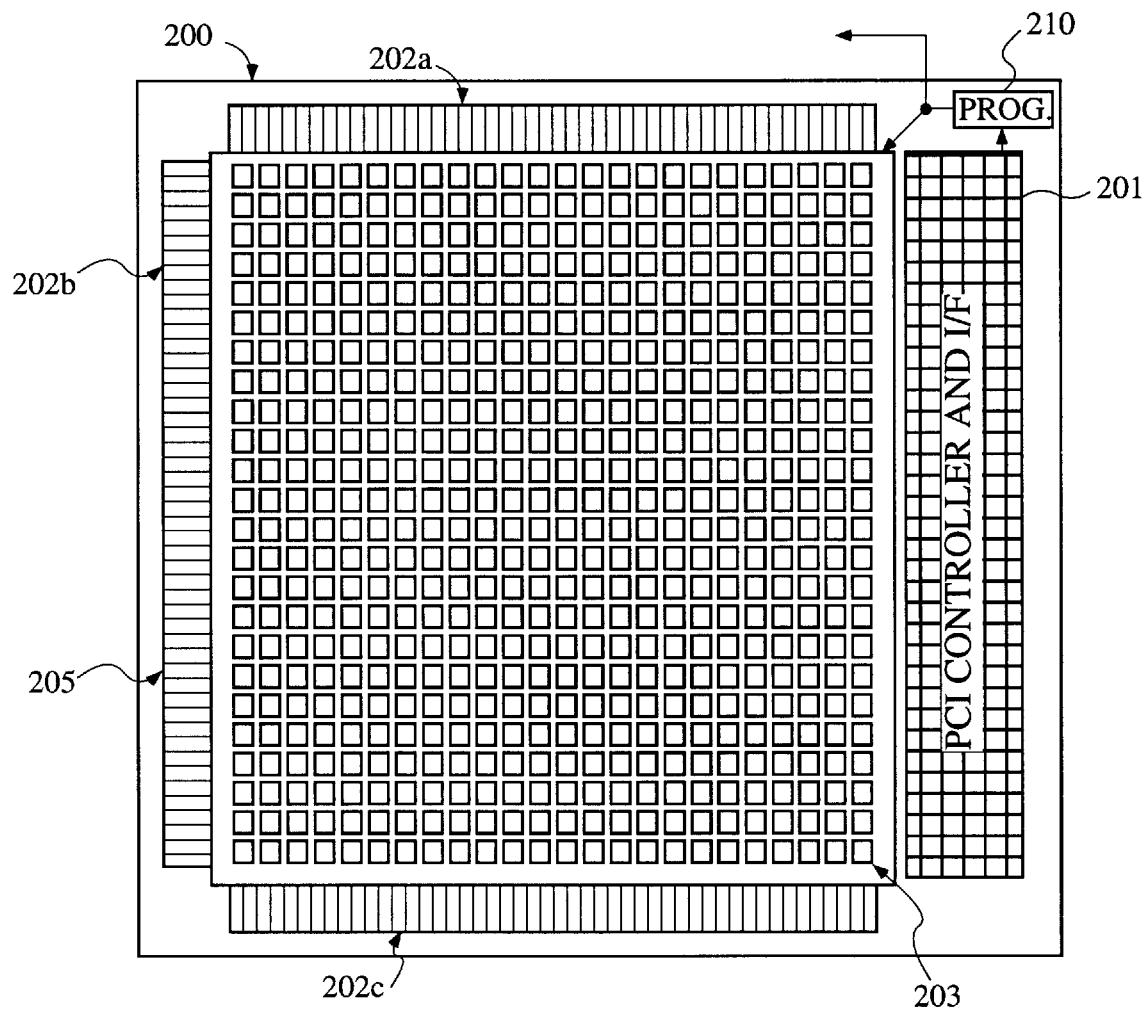
FIG. 2 is a layout diagram of an FPGA in accordance with one embodiment of the invention.

FIG. 2 is a layout diagram of a chip which includes an FPGA 200 in accordance with one embodiment of the invention. FPGA 200 includes a dedicated computer bus controller-interface circuit 201, a programmable portion 205 and a programming circuit 210. Programmable portion 205 includes three groups of input/output (I/O) blocks 202a, 202b and 202c, an array of configurable logic blocks (CLBs) 203 and programmable routing resources (not shown).

The programmable routing resources include interconnect segments which extend between I/O blocks 202a, 202b and 202c and CLBs 203, as well as programmable interconnect points which can be programmed to connect or isolate these interconnect segments. The programmable interconnect points are typically pass transistors which are located along the interconnect segments. The gates of the pass transistors are coupled to corresponding configuration memory cells. The configuration memory cells are programmed in response to a configuration bit stream using an implied addressing scheme, such that the configuration memory cells store logic high and logic low values. These logic high and logic low values are provided to the corresponding pass transistors, thereby turning the pass transistors on or off to connect and isolate the interconnect segments, thereby providing the desired connections between I/O blocks 202a, 202b and 202c and CLBs 203.

The previously described elements of programmable portion 205 are described in more detail in "The Programmable Logic Data Book", pp. 4-1 to 4-96, © 1996, available from Xilinx, Inc. as Part No. 0010303, which is hereby incorporated by reference.

In the described embodiment, CLB array 203 includes 24 rows and 24 columns of CLBs, for a total of 576 CLBs. Each of the three I/O block groups 202a–202c is located along a separate edge of FPGA 200, substantially surrounding CLB array 203 on three sides. Each group of I/O blocks 202a–202c includes 48 I/O blocks, for a total of 144 I/O blocks. Dedicated controller-interface circuit 201 is located along a fourth edge of FPGA 200.

In the described embodiment, FPGA 200 includes 304 pins (not shown). Fifty six of these pins are dedicated to computer bus controller-interface circuit 201. Each of these fifty six pins is located along the same edge of FPGA 200 as the controller-interface circuit 201. Thirty two data bits are provided on thirty two pins located such that these data bits can be conveniently routed through controller-interface circuit 201 to horizontal long lines (not shown) of CLB array 203. Each row of CLBs has two corresponding horizontal long lines which extend the length of CLB array 203. This configuration also allows the data bits to be easily relocated (shifted) along the CLB row boundaries. Computer bus controller-interface circuit 201 is coupled to programmable portion 205 using conventional programmable interconnect points (PIPS) of the FPGA 200.

Figure 3:
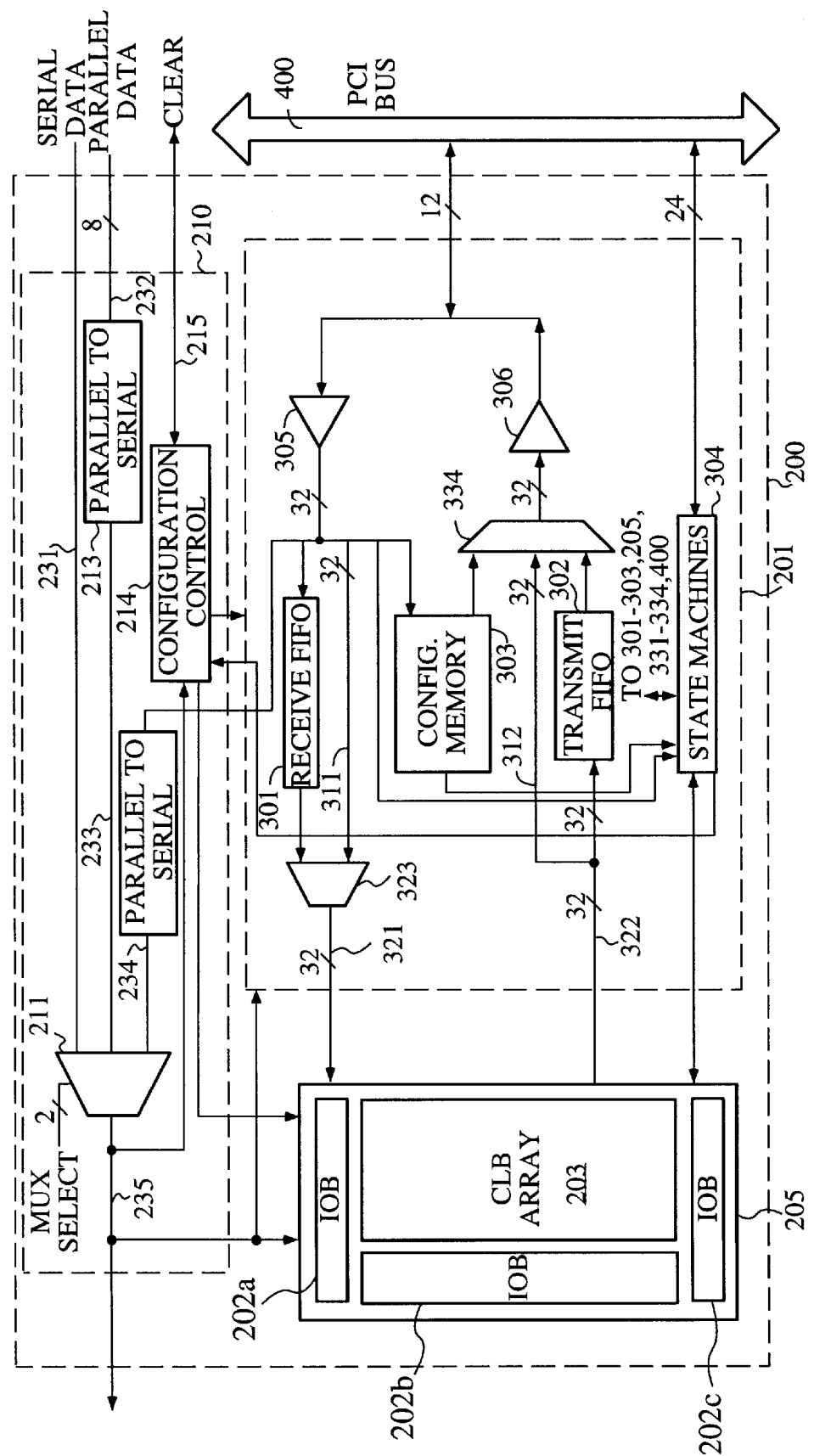
FIG. 3 is a block diagram which illustrates the FPGA of FIG. 2 in more detail.

FIG. 3 is a block diagram which illustrates the elements of computer bus controller-interface circuit 201 and programming circuit 210 in more detail. Computer bus controller-interface circuit 201 includes receive first in, first out (FIFO) memory 301, transmit FIFO memory 302, configuration memory 303, state machines 304, input buffer circuit 305, output buffer circuit 306, bypass buses 311 and 312, bidirectional input/output (I/O) circuit 331, demultiplexer circuit 332 and multiplexer circuits 333–334. Receive FIFO memory 301 and transmit FIFO memory 302 are each 32 bit×32 bit RAM based memories with fully asynchronous push and pop capabilities. In one embodiment, configuration memory 303 is programmed during device configuration with a device identification number and a vendor identification number specific to the particular application in which FPGA 200 is used.

In the described embodiment, external computer bus 400 is a conventional PCI bus. State machines 304 control connection of input buffer circuit 305 and output buffer circuit 306 to PCI bus 400 when controller-interface circuit 201 is receiving address/data information from PCI bus 400.

Input buffer circuit 305 provides output signals that fan out to five loctions. State machines 304 couple input buffer circuit 305 to bypass bus 311, receive FIFO 301, configuration memory 303, state machines 304, or programming circuit 210. Thus, receive FIFO memory 301 and bypass bus 311 can each receive data values from PCI bus 400 through input buffer circuit 305. Multiplexer circuit 333 is controlled by state machines 304 to route the output signals from either receive FIFO 301 or bypass bus 311 to programmable portion 205 on bus 321.

Transmit FIFO 302 and bypass bus 312 receive address/data information from programmable portion 205 on bus 322. Multiplexer circuit 334 is controlled by state machines 304 to route the output signals from either transmit FIFO 302 or bypass bus 312 to output buffer circuit 306. Buses 321 and 322 are optionally coupled to long lines within programmable portion 205 which extend across the length of FPGA 200.

In addition to being coupled to bidirectional I/O circuit 331 and multiplexer circuits 333–334, state machines 304 are also coupled to receive FIFO memory 301, transmit FIFO memory 302, programmable portion 205 and external computer bus 400. State machines 304 control the operation of FIFO memories 301–302. Read and write operations are performed by FIFO memories 301 and 302 in response to signals received from state machines 304. State machines 304 implement the bus protocol of external computer bus 400. In the described embodiment, for example, state machines 304 implement a conventional PCI bus protocol. By implementing controller-interface circuit 201 using dedicated logic rather than CLBs, area is saved on FPGA 200. The dedicated logic of controller-interface circuit 201 also provides the necessary paths for critical electrical/timing signals.

FPGA programming circuit 210 may be located at one of the corners of FPGA 200. Programming circuit 210 includes multiplexer 211, parallel-to-serial converters 212–213, and configuration control circuit 214. Multiplexer 211 is coupled to receive a serial configuration bit stream on bus 231. Multiplexer 211 is further coupled to receive a serial configuration bit stream on bus 233. The serial configuration bit stream provided on bus 233 is created by parallel-to-serial converter 213 in response to an external parallel configuration bit stream. Multiplexer 211 is further coupled to receive a serial configuration bit stream on bus 234. The serial configuration bit stream provided on bus 234 is created by parallel-to-serial converter 212 in response to a parallel configuration bit stream received from controller-interface circuit 201. Multiplexer 211 routes one of the serial configuration bit streams from one of buses 231, 233 and 234 to serial bus 235 in response to a multiplexer select signal. Serial bus 235 is coupled to provide the serial configuration bit stream to programmable portion 205, controller-interface circuit 201, configuration control circuit 214 and to a bus which is external to FPGA 200. Configuration control circuit 214 is coupled to receive (and provide) a CLEAR signal on bus 215. Configuration control circuit 214 is further coupled to receive a CLEAR signal from state machines 304, and to provide control signals to programmable portion 205 and controller-interface circuit 201. Programming circuit 210 is described in more detail below.

Although controller-interface circuit 201 is implemented with dedicated logic, controller-interface circuit 201 must be initially configured (initialized) to select certain programmable options within controller-interface circuit 201. These options can include, for example, the selection of the operating parameters of the FIFOs 301 and 302, or the particular interface to be provided between controller-interface circuit 201 and the programmable portion 205.

The initialization of controller-interface circuit 201 is performed by transmitting a configuration bit stream from an internal or external non-volatile memory, such as a serial PROM (SPROM) or an E²PROM. This configuration bit stream can be a serial bit stream provided on bus 231, or a parallel bit stream provided on bus 232. In either case, a serial bit stream is routed through multiplexer 211 to bus 235 in the manner previously described. The serial bit stream provided on bus 235 includes a header and programming information, which are received by configuration control circuit 214. In response to the header, configuration control circuit 214 transmits signals to controller-interface circuit 201 and programmable portion 205, thereby selecting the destination of the programming information. Thus, programming information can be loaded into controller interface circuit 201.

After controller-interface circuit 201 has been initialized, programmable portion 205 is configured. Controller-interface circuit 201 and programmable portion 205 are separately configurable entities. Programmable portion 205 can be configured (i.e., programmed) from several different sources. However, regardless of the source of the configuration data, in all cases, a serial configuration bit stream is ultimately routed through multiplexer 211 to programmable portion 205 on bus 235. Programmable portion 205 is then programmed, using an implied addressing scheme, in response to the serial configuration bit stream.

In one alternative, programmable portion 205 is programmed in response to data appended to the data stream used to initialize controller-interface circuit 201. Alternatively, programmable portion 205 can be configured as a separate operation (and from a separate source). The source of the configuration bit stream used to configure programmable portion 205 can either be external computer bus 400 or an internal or external non-volatile memory coupled to bus 231 or bus 232.

To program programmable portion 205 from external computer bus 400, an instruction is initially transmitted from computer bus 400 to state machines 304. In response to this instruction, state machines 304 control I/O circuit 331 and demultiplexer 332 to route subsequent configuration data provided on computer bus 400 to parallel to serial converter 212. State machines 304 also apply a 2-bit multiplexer select signal to the control terminal of multiplexer 211, thereby causing the output signal provided by parallel to serial converter 212 to be routed through multiplexer 211 to programmable portion 205 on bus 235. A parallel configuration bit stream is then provided on computer bus 400. In the manner previously described, this parallel configuration bit stream is routed from computer bus 400 to parallel to serial converter 212 through I/O circuit 331, input buffer 305 and demultiplexer 332. Parallel to serial converter 212 converts the parallel configuration bit stream to a serial configuration bit stream. This serial configuration bit stream is then routed to programmable portion 205 via serial bus 234, multiplexer 211 and serial bus 235. In an alternate embodiment, parallel-to-serial converter 212 is coupled to receive the parallel configuration bit stream from bus 321.

Configuration memory 303 is programmed with an address which enables an external device coupled to bus 400 to address FPGA 200. Such an address is routed from bus 400 to configuration memory 303 through bi-directional I/O circuit 331, input buffer 305 and demultiplexer 332. During normal operation of FPGA 200, configuration memory 303 provides the address to state machines 304. State machines 304 receive a current address from bus 400 (through I/O circuit 331, input buffer 305 and demultiplexer 332) and compare this current address with the address stored in configuration memory 303. A detected match indicates that FPGA 200 is being accessed by an external device via PCI bus 400.

If programmable portion 205 is programmed from an internal or external non-volatile memory, the programming data stream can be a serial or parallel data stream. For example, a serial configuration bit stream can be provided from the non-volatile memory to serial bus 231. In this case, state machines 304 provide a multiplexer select signal which causes multiplexer 211 to route the serial configuration bit stream from bus 231 to programmable portion 205 on serial bus 235.

Alternatively, a parallel configuration bit stream can be provided from the non-volatile memory to parallel bus 232. The parallel configuration bit stream is converted to a serial configuration bit stream by parallel-to-serial converter 213. The serial configuration bit stream is provided to serial bus 233. State machines 304 provide a multiplexer select signal which causes multiplexer 211 to route the serial configuration bit stream on serial bus 233 to programmable portion 205 on bus 235.

In addition to programming programmable portion 205, the serial configuration bit stream passed by multiplexer 211 can be routed off of FPGA 200 on serial output bus 235. A series of other FPGAs (not shown) thereby can be programmed in a daisy-chained manner from data transmitted on serial bus 235. These other FPGAs receive the serial data stream on a serial bus which is similar to serial bus 231 of FPGA 200.

To reconfigure programmable portion 205, a CLEAR instruction is provided to a configuration control circuit 214 in programming circuit 210 via a dedicated CLEAR line 215. In response to the CLEAR instruction, configuration control circuit 214 clears (i.e., erases) the previous configuration of programmable portion 205. However, configuration control circuit 214 does not re-initialize controller-interface circuit 201 in response to the CLEAR instruction. After programmable portion 205 has been cleared, the programmable portion 205 can be reconfigured using any of the previously described methods, including reconfiguration from the PCI bus 400. Consequently, programmable portion 205 can be reconfigured without having to re-initialize controller-interface circuit 201.

Alternatively, the CLEAR instruction can be communicated to configuration control circuit 214 via PCI bus 400. More specifically, the CLEAR instruction is transmitted from PCI bus 400 to state machines 304, which in turn, provide the CLEAR instruction to configuration control circuit 214. Configuration control circuit 214 the operates in the manner previously described to clear programmable portion 205. Configuration control circuit 214 can additionally transmit the CLEAR instruction received from state machines 304 to other external FPGAs on the dedicated CLEAR line 215.

Although the invention has been described in connection with several embodiments, it is understood that this invention is not limited to the embodiments disclosed, but is capable of various modifications which would be apparent to one of ordinary skill in the art. For example, although the configuration data stream provided by multiplexer 211 has been described as a serial data stream, it is understood that in other embodiments, this configuration data stream can be modified to be a parallel configuration data stream. Like the previously described embodiments, this embodiment uses an implied addressing scheme. Thus, the invention is limited only by the following claims.

What is claimed is:

1. A field programmable gate array (FPGA) comprising:

a dedicated bus controller-interface circuit for connecting to an external computer bus; and a programmable portion coupled to the bus controller-interface circuit, wherein the programmable portion is programmable by implied addressing to implement a logic circuit which is operably coupled to the external computer bus through the controller-interface circuit, wherein the dedicated bus controller-interface circuit and the programmable portion are separately programmable.

2. The FPGA of claim 1, wherein the external computer bus is a PCI bus.

3. The FPGA of claim 1, wherein the programmable portion is programmable from the external computer bus.

4. The FPGA of claim 1, further comprising a programming circuit coupled to receive a parallel configuration bit stream from the external computer bus, said programming circuit providing a configuration data stream in response to the parallel configuration bit stream, wherein the programmable portion is configured in response to the configuration data stream.

5. The FPGA of claim 1, wherein the programmable portion comprises:

a plurality of input/output (I/O) blocks; and an array of configurable logic blocks (CLBs) coupled to the I/O blocks.

6. The FPGA of claim 4, wherein the programming circuit further comprises an output terminal which routes the configuration data stream out of the FPGA, thereby allowing additional FPGAs to be programmed in a daisy-chained manner from the external computer bus.

7. The FPGA of claim 4, wherein the programming circuit comprises a parallel-to-serial converter which converts the parallel configuration bit stream to a serial configuration bit stream which forms the configuration data stream.

8. A field programmable gate array (FPGA) comprising:

a dedicated bus controller-interface circuit for connecting to an external computer bus; and a programmable portion coupled to the bus controller-interface circuit, wherein the programmable portion is programmable by implied addressing to implement a logic circuit which is operably coupled to the external computer bus through the controller-interface circuit, wherein the dedicated bus controller-interface circuit and the programmable portion are separately programmable, and wherein the bus controller-interface circuit comprises:

a receive first in, first out (FIFO) memory coupled between the external computer bus and the programmable portion;

a transmit FIFO memory coupled between the external computer bus and the programmable portion;

a state machine for controlling the receive and transmit FIFO memories, the state machine being coupled to the receive FIFO memory, the transmit FIFO memory, the programmable portion and the external computer bus; and a configuration memory coupled to the external computer bus, the configuration memory being programmable to configure the bus controller-interface circuit.

9. A method of operating a field programmable gate array (FPGA) comprising a dedicated bus controller-interface circuit and a programmable portion coupled to the bus controller-interface circuit, the method comprising the steps of:

initializing the dedicated bus controller-interface circuit to enable the bus controller-interface circuit to be operably coupled to an external bus; and then independently programming the configuration of the programmable portion using an implied addressing scheme.

10. The method of claim 9, wherein the step of programming the programmable portion further comprises the step of providing a configuration bit stream from the external computer bus to the programmable portion.

11. The method of claim 9, further comprising the steps of:

receiving a parallel configuration bit stream from the external computer bus; and programming the configuration of the programmable portion in response to the parallel configuration bit stream.

12. The method of claim 11, further comprising the steps of:

serializing the parallel configuration bit stream into a serial configuration bit stream; and providing the serial configuration bit stream to the programmable portion.

13. The method of claim 12, further comprising the steps of:

routing the serial configuration bit stream out of the FPGA;

programming additional FPGAs in a daisy-chained manner in response to the serial configuration bit stream.

* * * * *